(12) United States Patent
Kono et al.

(10) Patent No.: US 9,836,272 B2
(45) Date of Patent: Dec. 5, 2017

(54) AUDIO SIGNAL PROCESSING APPARATUS, METHOD, AND PROGRAM

(71) Applicant: SONY CORPORATION, Tokyo (JP)

(72) Inventors: Akifumi Kono, Tokyo (JP); Toru Chinen, Kanagawa (JP); Minoru Tsuji, Chiba (JP)

(73) Assignee: SONY CORPORATION, Tokyo (JP)

( * ) Notice: Subject to any disclaimer, the term of this patent is extended or adjusted under 35 U.S.C. 154(b) by 245 days.

(21) Appl. No.: 14/466,737

(22) Filed: Aug. 22, 2014

(65) Prior Publication Data

US 2015/0063600 A1    Mar. 5, 2015

(30) Foreign Application Priority Data

Sep. 3, 2013    (JP) .................................. 2013-182022

(51) Int. Cl.
*H03G 3/00*   (2006.01)
*G06F 3/16*   (2006.01)
*H03G 9/00*   (2006.01)
*H03G 9/02*   (2006.01)

(52) U.S. Cl.
CPC .............. *G06F 3/165* (2013.01); *H03G 9/005* (2013.01); *H03G 9/025* (2013.01)

(58) Field of Classification Search
CPC ........ H04R 1/28; H04R 1/283; H04R 19/005; H04R 19/016; H04R 19/04; H04R 1/2838; H04R 2499/11; G10K 11/1782
USPC .......... 381/55–58, 106, 107, 71.6, 333, 335, 381/365, 72
See application file for complete search history.

(56) References Cited

U.S. PATENT DOCUMENTS

| | | | | |
|---|---|---|---|---|
| 6,236,848 | B1* | 5/2001 | Igarashi | H04B 1/16 375/329 |
| 2005/0117754 | A1* | 6/2005 | Sakawaki | G10K 11/1782 381/71.6 |
| 2006/0089522 | A1* | 4/2006 | Rastatter | A61F 5/58 600/23 |
| 2008/0247587 | A1* | 10/2008 | Sato | H04R 1/2838 381/365 |

FOREIGN PATENT DOCUMENTS

| | | | | |
|---|---|---|---|---|
| JP | 2012-060379 | * | 3/2012 | ............... H03G 7/00 |
| JP | 2012-060379 A | | 3/2012 | |
| JP | 2012-235310 A | | 11/2012 | |

\* cited by examiner

*Primary Examiner* — Lun-See Lao
(74) *Attorney, Agent, or Firm* — Chip Law Group

(57) ABSTRACT

An audio signal processing apparatus that includes a band division section, an analysis section, a gain adjustment amount calculation section, and a gain adjustment section. The band division section is configured to generate a resonance in-band signal by band division on an audio input signal. The analysis section is configured to extract an amount of features from each of the resonance in-band signal and the input signal. The gain adjustment amount calculation section is configured to calculate a gain adjustment amount for a resonance frequency band in the input signal, the gain adjustment amount being calculated based on the amount of features of the resonance in-band signal and the amount of features of the input signal. The gain adjustment section is configured to perform a gain adjustment on the resonance frequency band in the input signal based on the gain adjustment amount.

12 Claims, 13 Drawing Sheets

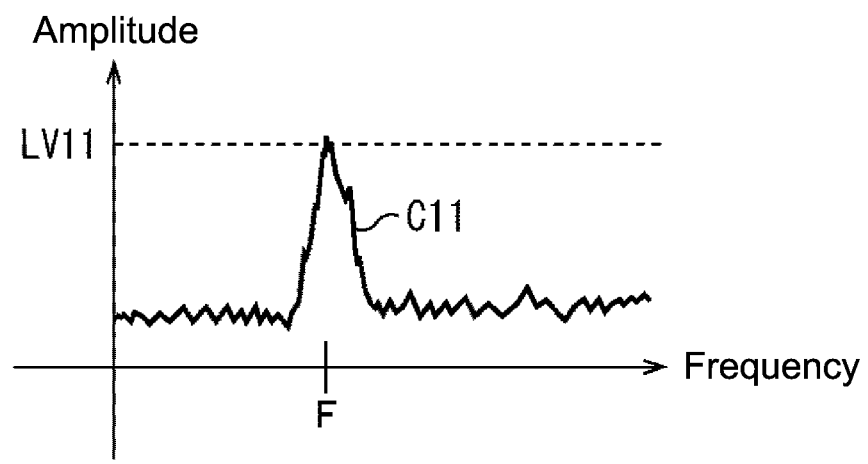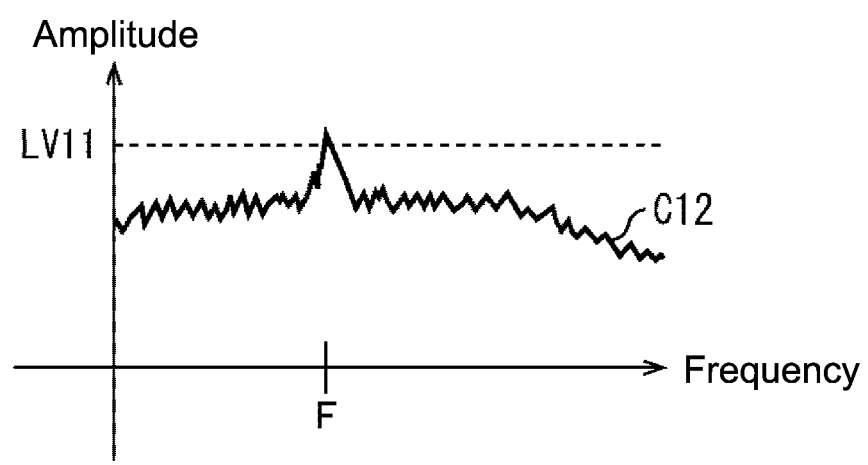
FIG.3

AUDIO SIGNAL PROCESSING APPARATUS, METHOD, AND PROGRAM

CROSS REFERENCE TO RELATED APPLICATIONS

This application claims the benefit of Japanese Priority Patent Application JP 2013-182022 filed Sep. 3, 2013, the entire contents of which are incorporated herein by reference.

BACKGROUND

The present disclosure relates to audio signal processing apparatuses, methods, and programs, and more specifically, to an audio signal processing apparatus, method, and program that obtain higher quality sound.

The recent size reduction of mobile devices such as notebook personal computers (PCs) often causes resonance during sound reproduction. This is because a speaker is positioned inevitably close to other components including a substrate, a keyboard, or others, or the components themselves are already smaller in size or thinner in width.

However, because taking tangible measures against resonance takes cost, such measures may be taken only within the constraints of cost, or resonance may be involuntarily accepted. As a result, the sound quality suffers.

As other measures against resonance, the sound volume may be reduced as a whole not to cause resonance. If this is the case, however, sound from some sources may be reduced too much and become inaudible, or the resulting sound may not be of satisfactory quality. In consideration thereof, there is a technology proposed to reduce resonance by reducing a gain in a resonance frequency band using a notch filter or others.

When a mobile device including a small-sized speaker such as a notebook PC reproduces movie or music contents, the sound volume is known to be low as a whole.

In order to make the sound easier to listen, there are technologies of enhancing the reproduction level of an audio signal of the sound (for example, refer to Patent Application Laid-open Nos. 2012-60379 and 2012-235310). With these technologies, the reproduction level is described to be enhanced by a dynamic change of features observed in an amplitude modulation function in response to the analysis result of an input audio signal.

SUMMARY

With the above-mentioned technologies, however, the quality of the resulting sound is not high enough. This is because, in resonance phenomena, even if the signal level is uniform in the resonance frequency band, the degree of resonance may be affected by the signal level in the remaining frequency band, for example.

Therefore, with the technology of determining the reducing amount of gain based only on the resonance frequency band using a notch filter or others, gain reduction is performed also on signals that are not targets therefor. This thus adversely affects the sound volume and quality.

Moreover, with the technology of enhancing the reproduction level, if the reproduction level is enhanced by a notebook PC or others, this may increase the above-mentioned resonance, thereby further adversely affecting the sound quality. Also with this technology, the reproduction level is not allowed to be sufficiently enhanced to reduce resonance. The quality of the resulting sound is thus not high enough. It is thus desirable to provide higher quality sound.

According to an embodiment of the present disclosure, there is provided an audio signal processing apparatus, including a band division section configured to generate a resonance in-band signal by band division on an audio input signal, an analysis section configured to extract an amount of features from each of the resonance in-band signal and the input signal, a gain adjustment amount calculation section configured to calculate a gain adjustment amount for a resonance frequency band in the input signal, the gain adjustment amount being calculated based on the amount of features of the resonance in-band signal and the amount of features of the input signal, and a gain adjustment section configured to perform a gain adjustment on the resonance frequency band in the input signal based on the gain adjustment amount.

The gain adjustment amount calculation section may calculate the gain adjustment amount based on the amount of features using a statistical analysis model generated by learning.

The gain adjustment amount calculation section may calculate the gain adjustment amount for each of the resonance frequency bands, and the gain adjustment section may perform the gain adjustment on each of the resonance frequency bands.

The audio signal processing apparatus may further include a mapping control information determination section, and a mapping processing section. The mapping control information determination section is configured to determine mapping control information based on an amount of reproduction level enhancement features and information, the amount of reproduction level enhancement features being extracted from the input signal, and the information being generated by learning for obtaining the mapping control information from the amount of reproduction level enhancement features. The mapping processing section is configured to perform amplitude modulation on the gain-adjusted input signal based on a linear or nonlinear mapping function defined by the mapping control information. The gain adjustment amount calculation section may calculate the gain adjustment amount based on the mapping control information and the amount of features extracted by the analysis section.

The gain adjustment amount may be increased with the greater proportion of the resonance in-band signal included in the input signal.

The band division section may divide the input signal into the resonance in-band signal and a resonance out-of-band signal, the gain adjustment section performs the gain adjustment on the resonance in-band signal, and the audio signal processing apparatus further includes an addition section configured to add the gain-adjusted resonance in-band signal and the resonance out-of-band signal.

According to an embodiment of the present disclosure, there is provided an audio signal processing method or program, including generating a resonance in-band signal by band division on an audio input signal, extracting an amount of features from each of the resonance in-band signal and the input signal, calculating a gain adjustment amount for a resonance frequency band in the input signal, the gain adjustment amount being calculated based on the amount of features of the resonance in-band signal and the amount of features of the input signal, and performing a gain adjustment on the resonance frequency band in the input signal based on the gain adjustment amount.

In an embodiment of the present disclosure, a resonance in-band signal is generated by band division on an audio input signal, an amount of features is extracted from each of the resonance in-band signal and the input signal, and based on the amount of features of the resonance in-band signal and the amount of features of the input signal, a gain adjustment amount is calculated for a resonance frequency band in the input signal, and based on the gain adjustment amount, a gain adjustment is performed on the resonance frequency band in the input signal. According to an embodiment of the present disclosure, higher quality sound is obtained.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 3 is a diagram illustrating occurrence of resonance;

DETAILED DESCRIPTION OF EMBODIMENTS

Hereinafter, embodiments of the present disclosure will be described with reference to the drawings.

First Embodiment

Exemplary Configuration of Audio Signal Processing Apparatus

Figure 1:
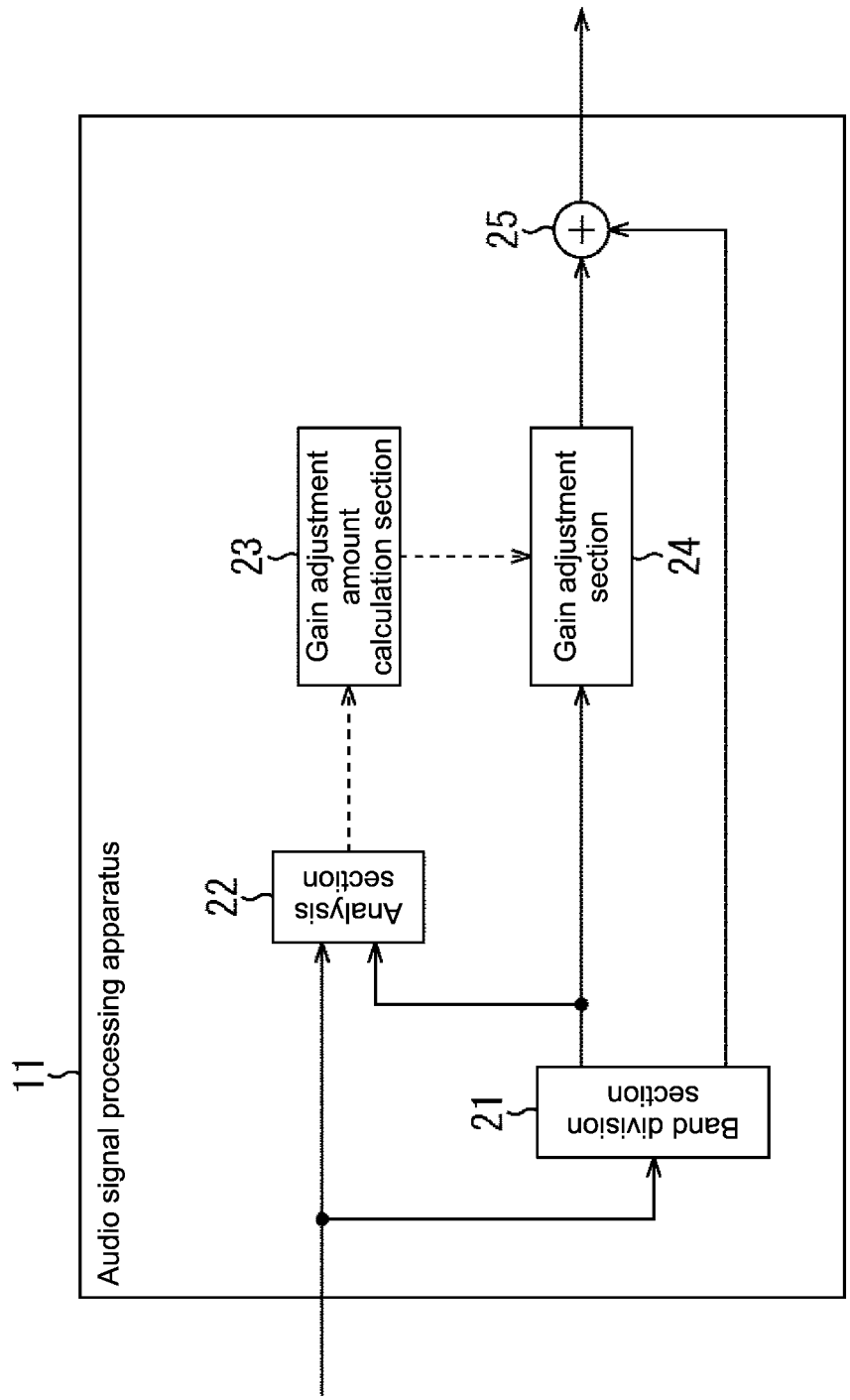
FIG. 1 is a diagram showing an exemplary configuration of an audio signal processing apparatus.

FIG. 1 is a diagram showing an exemplary configuration of an audio signal processing apparatus with the application of the present disclosure. The audio signal processing apparatus is exemplified by a notebook PC.

An audio signal processing apparatus 11 includes a band division section 21, an analysis section 22, a gain adjustment amount calculation section 23, a gain adjustment section 24, and an addition section 25. In the audio signal processing apparatus 11, an input signal being an audio signal of sound is supplied to both the band division section 21 and the analysis section 22.

The band division section 21 is exemplified by a band-pass filter, and performs band division on the input signal to generate signals therefrom, i.e., a resonance in-band signal, and a resonance out-of-band signal. That is, by band division performed on the input signal, the input signal is divided into a resonance in-band signal and a resonance out-of-band signal. The band division section 21 supplies the resonance in-band signal to both the analysis section 22 and the gain adjustment section 24, and the resonance out-of-band signal to the addition section 25.

In this embodiment, the resonance in-band signal is at a predetermined resonance frequency in the input signal, i.e., includes a resonance-frequency band component. That is, the resonance in-band signal is a signal of a resonance-frequency band component that is expected to be reduced in the input signal.

The resonance out-of-band signal includes a component remaining in the input signal after the removal of the resonance-frequency band component therefrom. That is, the resonance out-of-band signal is a signal not including the resonance-frequency band component but a remaining frequency-band component in the input signal, which is not expected to be reduced.

The analysis section 22 extracts an amount of features for resonance analysis from the provided signals, i.e., the input signal, and the resonance in-band signal from the band division section 21. The obtained amount of resonance analysis features is supplied to the gain adjustment amount calculation section 23. Based on the amount of the resonance analysis features provided by the analysis section 22, the gain adjustment amount calculation section 23 calculates a gain adjustment amount optimum for reducing the resonance-frequency band component in the input signal. The obtained gain adjustment amount is supplied to the gain adjustment section 24.

Based on the gain adjustment amount provided by the gain adjustment amount calculation section 23, the gain adjustment section 24 modulates the amplitude of the resonance in-band signal provided by the band division section 21 so that the resonance in-band signal is adjusted in gain. The resulting resonance in-band signal is supplied to the addition section 25.

The addition section 25 adds together the signals, i.e., the resonance in-band signal from the gain adjustment section 24 and the resonance out-of-band signal from the band division section 21, to generate an output signal for output where the resonance-frequency band component in the input signal is reduced.

[Description about Process of Reducing Resonance-Frequency Band Component]

Described next is the operation of the audio signal processing apparatus 11. Upon reception of an input signal, the audio signal processing apparatus 11 starts a process of reducing a resonance-frequency band component to generate an output signal. By referring to a flowchart of FIG. 2, described below is the resonance-frequency band component reduction process by the audio signal processing apparatus 11.

In step S11, the band division section 21 divides the input signal into a resonance in-band signal and a resonance out-of-band signal. The resonance in-band signal is supplied to both the analysis section 22 and the gain adjustment section 24, and the resonance out-of-band signal is supplied to the addition section 25. For generating the resonance in-band signal and the resonance out-of-band signal, the input signal is subjected to filter processing using a band-pass filter, for example.

In step S12, the analysis section 22 extracts an amount of features for resonance analysis from the provided signals, i.e., the input signal, and the resonance in-band signal from the band division section 21. The obtained amount of resonance analysis features is supplied to the gain adjustment amount calculation section 23.

To be specific, by Equation 1 below, the analysis section 22 calculates a root mean square RMS_ab(n) of the input signal for the interval thereof including N pieces of samples with the n-th sample being the center, which is a processing target in the input signal, for example. The resulting root mean square is used as the amount of resonance analysis features.

[Equation 1]

$$RMS\_ab(n) = 20.0 \times \log_{10}\left(\sqrt{\frac{1}{N} \cdot \sum_{m=n-N/2}^{N/2-1} x(m)^2}\right) \quad (1)$$

In Equation 1, x(m) denotes the m-th sample in the input signal, and the input signal is assumed to be so normalized that the value of each sample x(m) satisfies $-1.0 \leq x(m) \leq 1.0$.

Moreover, by Equation 2 below, the analysis section 22 calculates a root mean square RMS_rb(n) of the resonance in-band signal for the interval thereof including N pieces of samples with the n-th sample being the center, which is a processing target in the resonance in-band signal. The resulting root mean square is also used as the amount of resonance analysis features.

[Equation 2]

$$RMS\_rb(n) = 20.0 \times \log_{10}\left(\sqrt{\frac{1}{N} \cdot \sum_{m=n-N/2}^{N/2-1} x\_rb(m)^2}\right) \quad (2)$$

In Equation 2, x_rb(m) denotes the m-th sample in the resonance in-band signal, and the resonance in-band signal is assumed to be so normalized that the value of each sample x_rb(m) satisfies $-1.0 \leq x\_rb(m) \leq 1.0$.

The amount of resonance analysis features obtained as above, i.e., the root mean square RMS_ab(n) of the input signal, and the root mean square RMS_rb(n) of the resonance in-band signal, is supplied to the gain adjustment amount calculation section 23.

Described above is the case of calculating root mean squares for use as an amount of resonance analysis features, but the amount of resonance analysis features is not restrictive thereto. Alternatively, in addition to the root mean square, the amount of resonance analysis features for use may be the t-th power of the root mean square (where t≥2), a tone level, or a true peak level obtained by further dividing the resonance frequency band, or an arbitrary combination thereof. Still alternatively, the amount of resonance analysis features for use may be the logarithm of the value of the root mean square, the logarithm of the t-th power of the root mean square, the logarithm of the value of a tone level, the logarithm of the value of a true peak level, or others.

In the above description, a band-pass filter for analysis of an input signal and a resonance in-band signal is used. Alternatively, any other filters may be used therefor, or the frequency domain may be used to divide the input signal or to extract and analyze features.

In step S13, based on the amount of resonance analysis features provided by the analysis section 22, the gain adjustment amount calculation section 23 calculates a gain adjustment amount optimum for reducing the resonance-frequency band component in the input signal. The obtained gain adjustment amount is supplied to the gain adjustment section 24.

With a thorough analysis on resonance phenomena, the degree of resonance is known to vary with the level of an input signal, i.e., the value of a root mean square RMS_ab(n), even when a resonance in-band signal remains in the same level, i.e., even when a root mean square RMS_rb(n) thereof shows no change.

FIG. 3 shows an exemplary simple signal. In FIG. 3, the vertical and horizontal axes respectively indicate amplitude and a frequency, and F on the frequency axis indicates a resonance frequency.

In FIG. 3, line graphs C11 and C12 show frequency responses of two different signals. The line graph C11 shows the frequency response of an input signal with which resonance easily occurs, and the line graph C12 shows the frequency response of an input signal with which resonance hardly occurs, for example.

With a comparison between the line graphs C11 and C12, the two signals both have the signal level (amplitude) of LV11 in the resonance frequency band, i.e., at the resonance frequency F. However, the signal of the line graph C11 has a tendency to cause resonance easily because the component at the resonance frequency F is dominant therein. That is, in the signal of the line graph C11, the component at the resonance frequency F is conspicuously high in level compared with other frequency components.

On the other hand, the signal of the line graph C12 has a tendency not to cause resonance easily because the component at the resonance frequency F is not dominant therein, or with the signal, resonance is negligible even if it occurs.

As the signal of the line graph C12, when an input signal is not only high in level of the component at the resonance frequency F but also high in level of other frequency components, a gain adjustment amount for a resonance in-band signal in the signal may often be smaller than that for a resonance in-band signal in the signal of the line graph C11. Therefore, if the signals of the line graphs C11 and C12 share the same gain adjustment amount for their resonance in-band signals, this causes too much reduction of gain in the resonance in-band signal in the signal of the line graph C12, thereby adversely affecting the sound volume and sound pressure.

In consideration thereof, the audio signal processing apparatus 11 prevents too much reduction of gain by considering not only the level of a resonance in-band signal but also the level of an input signal, i.e., considering the balance with the entire frequency band in the input signal when calculating a gain adjustment amount for the resonance in-band signal.

To be specific, the gain adjustment amount calculation section 23 calculates a gain adjustment amount using a gain adjustment model, which is learned in advance based on statistical analysis.

For the learning of the gain adjustment model, a dependent variable is a gain adjustment amount F(X, Y), and independent variables are root mean squares RMS_ab(n) and RMS_rb(n) extracted from an audio signal for learning, the square of these root mean squares, and an offset term irrelevant to the root mean squares and the square thereof.

The gain adjustment model recorded on the gain adjustment amount calculation section 23 is a statistical analysis model of Equation 3 below, which is learned in advance based on these dependent and independent variables.

[Equation 3]

$$F(X,Y)=aX^2+bX+cY^2+dY+e(-1.0 \le X, Y \le 1.0) \quad (3)$$

In Equation 3 above, a, b, c, d, and e are each a model parameter.

Figure 4:
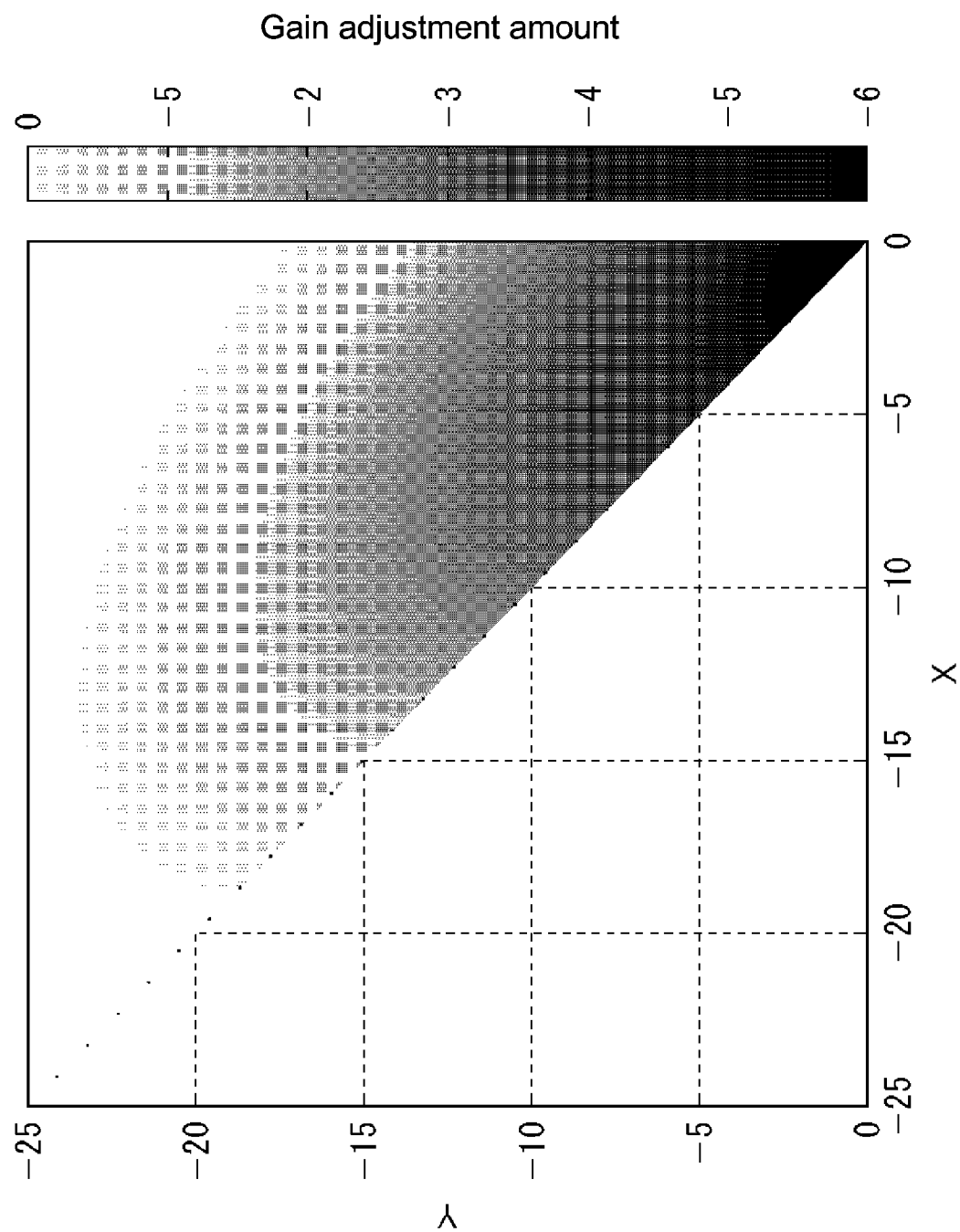
FIG. 4 is a diagram showing an exemplary gain adjustment model.

FIG. 4 shows an exemplary learning result of the gain adjustment model when X in Equation 3 is the root mean square RMS_ab(n), and Y therein is the root mean square RMS_rb(n).

In FIG. 4, an X axis being a horizontal axis indicates the root mean square RMS_ab(n), and a Y axis being a vertical axis indicates the root mean square RMS_rb(n). The shaded portion indicates a gain adjustment amount F(X, Y), and the darker portion means the higher absolute value of the gain adjustment amount, i.e., in the portion, the resonance frequency band is further reduced.

In this embodiment, as a resonance in-band signal takes up a greater proportion of an input signal, a gain adjustment amount shows an increase so that a resonance-frequency band component is reduced to a further degree. As an example, when the root mean square RMS_ab(n) takes a fixed value, the absolute value of a gain adjustment amount is increased with the larger power of a resonance in-band signal, i.e., the larger root mean square RMS_rb(n).

As described above, the relationship between an input signal and a resonance in-band signal is used as a basis to determine an appropriate gain adjustment amount. This accordingly prevents too much reduction of a resonance-frequency band component so that the gain adjustment is performed more appropriately.

For the learning of model parameters as a gain adjustment model, learning data for use includes an audio signal causing resonance, and an audio signal not causing resonance. For each of a plurality of pieces of the learning data, an appropriate gain adjustment amount is manually determined in advance for reproduction of the learning data. An independent variable for use is an amount of resonance analysis features extracted from the learning data. Therefore, the gain adjustment amount actually regarded as optimum by people, i.e., the actual human perception, may affect the learning so that the resulting gain adjustment model may be optimum.

By using the gain adjustment model generated by the learning as above, the gain adjustment amount calculation section 23 calculates a gain adjustment amount based on the amount of resonance analysis features provided by the analysis section 22, i.e., the root mean squares RMS_ab(n) and RMS_rb(n). To be specific, the root mean squares RMS_ab(n) and RMS_rb(n) are substituted into Equation 3 above, and the resulting value of F(X, Y) is used as the gain adjustment amount.

Described above is the technique of using a statistical analysis model for calculating a gain adjustment amount. Alternatively, the gain adjustment amount may be calculated using a simple linear or nonlinear function or table.

Figure 2:
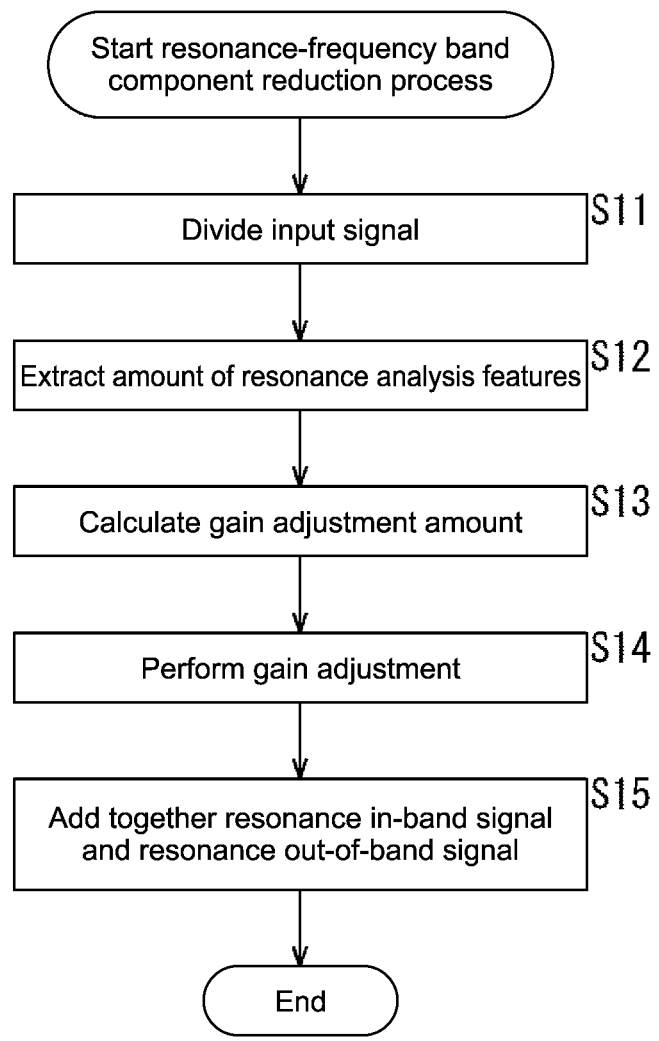
FIG. 2 is a flowchart of a resonance-frequency band component reduction process by the audio signal processing apparatus of FIG. 1.

By referring back to the flowchart of FIG. 2, after the gain adjustment amount is calculated in step S13, the procedure goes to step S14.

In step S14, based on the gain adjustment amount from the gain adjustment amount calculation section 23, the gain adjustment section 24 modulates the amplitude of the resonance in-band signal from the band division section 21. With such amplitude modulation, the gain adjustment section 24 performs a gain adjustment on the resonance in-band signal, and supplies the resulting resonance in-band signal to the addition section 25. In the resulting input signal, the resonance frequency band is done with the gain adjustment.

In step S15, the addition section 25 adds together the provided signals, i.e., the resonance in-band signal from the gain adjustment section 24, and the resonance out-of-band signal from the band division section 21, to generate an output signal for output. Upon output of the output signal, the resonance-frequency band component reduction process is ended.

In the manner described above, the audio signal processing apparatus 11 extracts an amount of features for resonance analysis from an input signal and a resonance in-band signal, and by using a gain adjustment amount obtained based on the amount of resonance analysis features, performs a gain adjustment on the resonance in-band signal.

By calculating a gain adjustment amount using the amount of resonance analysis features obtained from an input signal and a resonance in-band signal, a resonance-frequency band component is reduced more appropriately in the input signal so that the resulting audio is improved in quality.

To be specific, when the level of a resonance out-of-band signal is lower than that of a resonance in-band signal, i.e., when an input signal easily causes resonance, the gain therein is further reduced. On the other hand, when the level of the resonance out-of-band signal is not lower than that of the resonance in-band signal, i.e., when the input signal hardly causes resonance or causes negligible resonance, the gain therein is not reduced.

As described above, with the audio signal processing apparatus 11, resonance is optimally reduced considering the degree thereof. This accordingly prevents too much reduction of a gain in a resonance in-band signal so that the resulting audio is high in volume and good in quality.

Moreover, because any tangible measures against resonance are not expected any more, there are no more restrictions on hardware design. The cost is accordingly reduced thereby, or the saved cost may be utilized to improve the performance and quality of other components.

Second Embodiment

Exemplary Configuration of Audio Signal Processing Apparatus

Described in the first embodiment is the case of dividing an input signal for extracting a resonance in-band signal therefrom. As to a resonance frequency, other frequencies being integer multiples thereof are generally regarded also as resonance frequencies.

Figure 5:
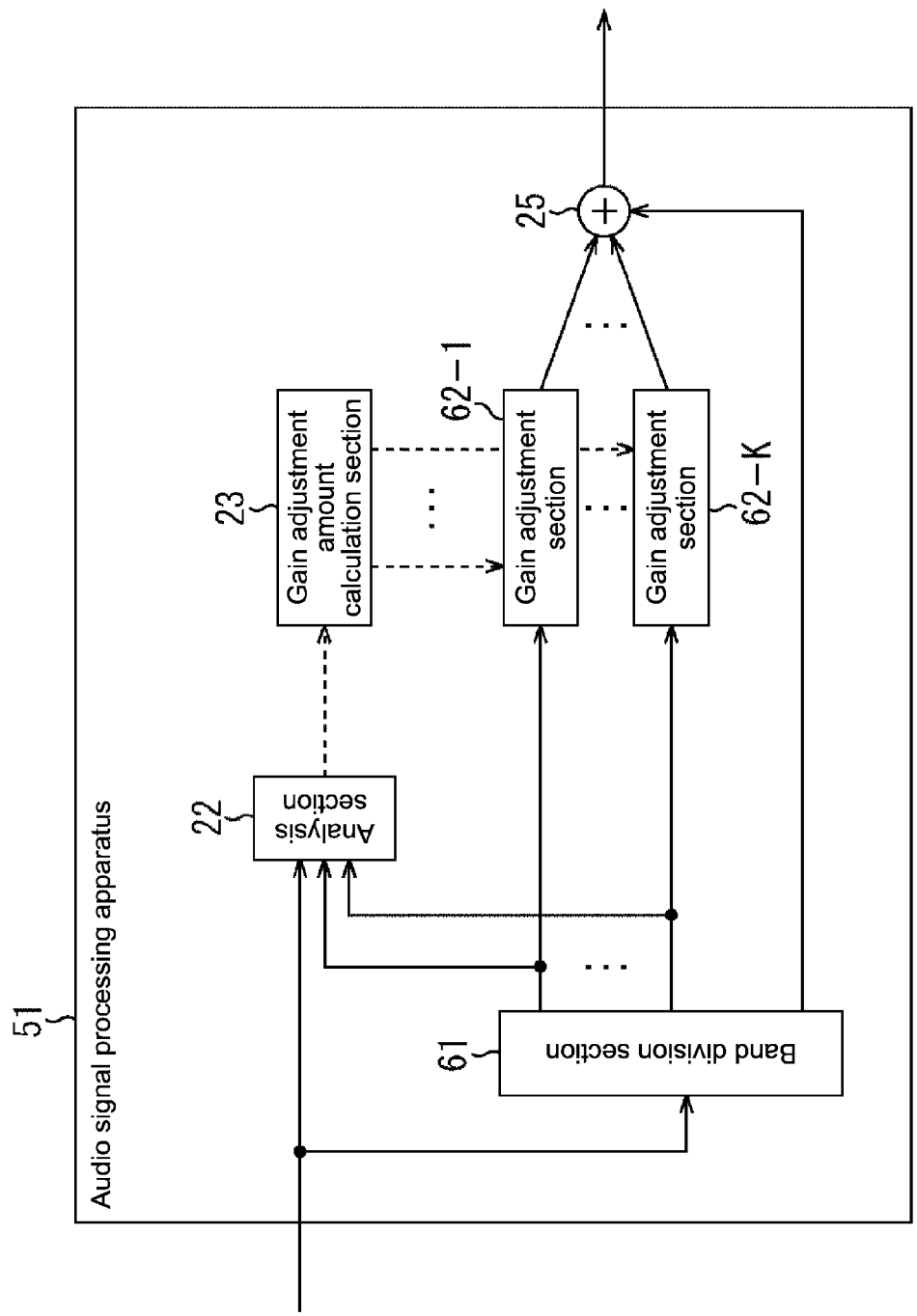
FIG. 5 is a diagram showing another exemplary configuration of the audio signal processing apparatus of FIG. 1.

In consideration thereof, a gain adjustment may be performed on a plurality of resonance in-band signals to more effectively reduce resonance therein. If this is the case, the audio signal processing apparatus is configured as shown in FIG. 5, for example. In FIG. 5, any component corresponding to that in FIG. 1 is provided with the same reference numeral, and is not described again if appropriate.

An audio signal processing apparatus 51 of FIG. 5 includes a band division section 61, the analysis section 22, the gain adjustment amount calculation section 23, gain adjustment sections 62-1 to 62-K, and the addition section 25.

The band division section 61 divides an input signal into K resonance in-band signals, and a resonance out-of-band signal. Herein, the K resonance in-band signals each include a different resonance-frequency band component in the input signal, and their resonance frequency bands all cause resonance. For example, the K resonance frequency bands are integer multiples of a predetermined resonance frequency band.

The band division section 61 supplies the K resonance in-band signals to the analysis section 22 and the gain adjustment sections 62-1 to 62-K, and the resonance out-of-band signal to the addition section 25.

The analysis section 22 extracts an amount of features for resonance analysis from each of the provided signals, i.e., the input signal, and the K resonance in-band signals from the band division section 61. The obtained amount of resonance analysis features is supplied to the gain adjustment amount calculation section 23. Based on the amount of resonance analysis features provided by the analysis section 22, the gain adjustment amount calculation section 23 calculates a gain adjustment amount optimum for reducing the resonance-frequency band component in each of the K resonance frequency bands in the input signal. The obtained gain adjustment amount is supplied to the gain adjustment sections 62-1 to 62-K.

Based on the gain adjustment amount provided by the gain adjustment amount calculation section 23, the gain adjustment sections 62-1 to 62-K respectively modulate the amplitude of the resonance in-band signals provided by the band division section 61 so that the resonance in-band signals are adjusted in gain. The resulting resonance in-band signals are all supplied to the addition section 25.

In the below, the gain adjustment sections 62-1 to 62-K may be sometimes simply referred to as gain adjustment sections 62 when no distinction is expected there among.

The addition section 25 adds together the provided signals, i.e., the resonance in-band signals from the gain adjustment sections 62-1 to 62-K, and the resonance out-of-band signal from the band division section 61, to generate an output signal for output.

[Description about Process of Reducing Resonance-Frequency Band Component]

Figure 6:
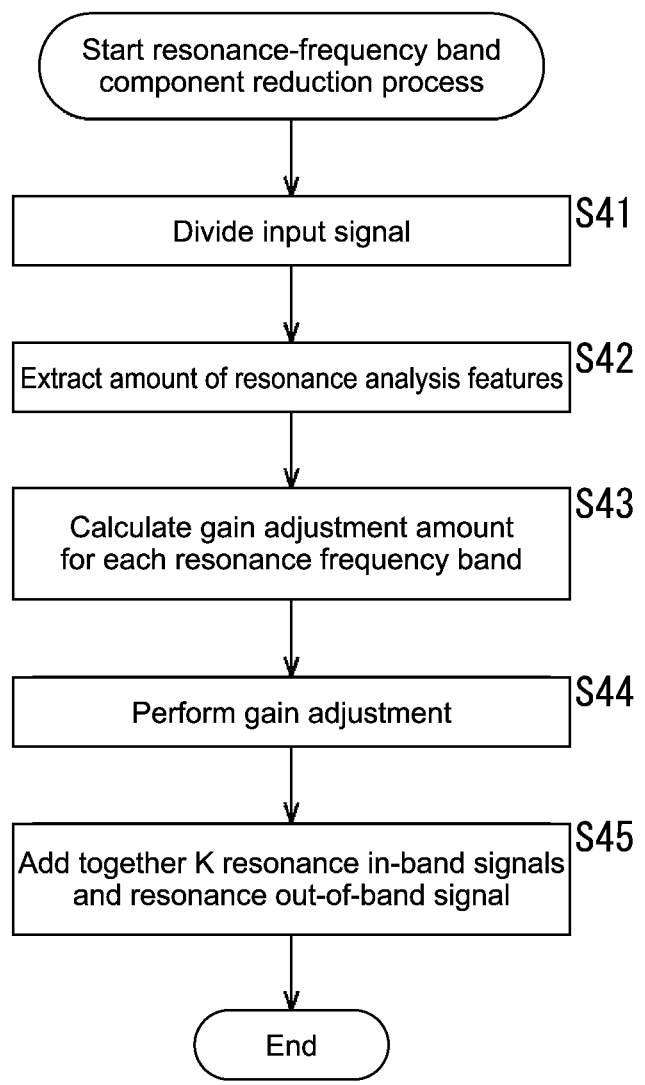
FIG. 6 is a flowchart of a resonance-frequency band component reduction process by the audio signal processing apparatus of FIG. 5.

By referring to a flowchart of FIG. 6, described next is a process of reducing a resonance-frequency band component to be performed by the audio signal processing apparatus 51.

In step S41, the band division section 61 divides an input signal into resonance in-band signals of K resonance frequency bands, and a resonance out-of-band signal. The resonance in-band signals are supplied to the analysis section 22 and the gain adjustment sections 62, and the resonance out-of-band signal is supplied to the addition section 25.

To be specific, the K resonance in-band signals are all supplied to the analysis section 22, and the resonance in-band signals of the first to K-th resonance frequency bands are respectively supplied to the gain adjustment sections 62-1 to 62-K.

In step S42, the analysis section 22 extracts an amount of features for resonance analysis from the provided signals, i.e., the input signal, and the K resonance in-band signals from the band division section 61. The obtained amount of resonance analysis features is supplied to the gain adjustment amount calculation section 23.

To be specific, by Equation 1 above, the analysis section 22 calculates a root mean square RMS_ab(n) of the input signal for use as the amount of resonance analysis features, for example.

By Equation 2 similarly to the above for each of the K resonance frequency bands, the analysis section 22 calculates a root mean square RMS_rbi(n) of each of the resonance in-band signals for use as the amount of resonance analysis features. Herein, $1 \le i \le K$ is satisfied, and the root mean square RMS_rbi(n) is a root mean square of one of the resonance in-band signals being the i-th resonance-frequency band component.

In step S43, based on the amount of resonance analysis features provided by the analysis section 22, the gain adjustment amount calculation section 23 calculates a gain adjustment amount optimum for reducing the resonance-frequency band components in the input signal on the basis of each of the K resonance frequency bands. The obtained gain adjustment amount is supplied to the gain adjustment sections 62.

The gain adjustment amount calculation section 23 is recorded with a gain adjustment model, more specifically model parameters, of Equation 3 above for each of the K resonance frequency bands. For the learning of the gain adjustment model for the i-th resonance frequency band (where $1 \le i \le K$), an independent variable Y and a dependent variable in use are respectively the root mean square RMS_rbi(n) and the gain adjustment amount for the i-th resonance frequency band.

The gain adjustment amount calculation section 23 substitutes the root mean square RMS_ab(n) and the root mean square RMS_rbi(n) of the i-th resonance frequency band into Equation 3 above, which is represented using the model parameters for the i-th resonance frequency band. The resulting value of F(X, Y) is used as a gain adjustment amount for the i-th resonance frequency band. The gain adjustment amount calculation section 23 then supplies the gain adjustment amount obtained for the i-th resonance frequency band to the gain adjustment section **62-*i*** (where $1 \le i \le K$).

Alternatively, for calculating the gain adjustment amount for the i-th resonance frequency band, a root mean square of any other resonance frequency band may be used. If this is the case, the gain adjustment model for the i-th resonance frequency band is a statistical analysis model of Equation 4 below, for example.

[Equation 4]

$$F(X, Y_1, \ldots, Y_K) = aX^2 + bX + c_1 Y_1^2 + d_1 Y_1 + c_2 Y_2^2 + d_2 Y_2 + \ldots + c_K Y_K^2 + d_K Y_K + e \quad (4)$$

In Equation 4, X denotes a root mean square RMS_ab(n), and $Y_1$ to $Y_K$ respectively denote root mean squares RMS_rb1(n) to RMS_rbK(n). In this embodiment, for the learning of the gain adjustment model, independent variables in use include the root mean square RMS_ab(n) and the root mean squares RMS_rb1(n) to RMS_rbK(n) of the K resonance frequency bands, and a dependent variable in use is the gain adjustment amount for the i-th resonance frequency band. Herein, a, b, $c_1$ to $c_K$, $d_1$ to $d_K$, and e are each a model parameter.

In this case, the gain adjustment amount calculation section 23 substitutes the root mean square RMS_ab(n) and the K root mean squares RMS_rbi(n) into Equation 4 above. The resulting value of $F(X, Y_1, \ldots, Y_K)$ is used as the gain adjustment amount for the i-th resonance frequency band.

Alternatively, for the learning of a gain adjustment model, the root mean square RMS_ab(n) and the K root mean squares RMS_rbi(n) may be used, and the resulting gain adjustment model may be shared among the K resonance frequency bands, for example.

In step S44, based on the gain adjustment amount from the gain adjustment amount calculation section 23, the gain adjustment sections 62 respectively modulate the amplitude of the resonance in-band signals from the band division section 61. With such amplitude modulation, the gain adjustment sections 62 respectively perform a gain adjustment on the resonance in-band signals, and supply the resulting resonance in-band signals to the addition section 25. To be specific, by using the gain adjustment amount for the i-th resonance frequency band, the gain adjustment section 62-$i$ (where $1 \leq i \leq K$) performs a gain adjustment on the resonance in-band signal of the i-th resonance frequency band.

In step S45, the addition section 25 adds together the provided signals, i.e., the K resonance in-band signals from the K gain adjustment sections 62, and the resonance out-of-band signal from the band division section 61, to generate an output signal for output. Upon output of the output signal, the resonance-frequency band component reduction process is ended.

In the manner described above, the audio signal processing apparatus 51 extracts an amount of features for resonance analysis from an input signal and a plurality of resonance in-band signals. By using a gain adjustment amount obtained based on the obtained amount of resonance analysis features, the audio signal processing apparatus 51 then performs a gain adjustment on the resonance in-band signals on the resonance frequency band basis. This leads to appropriate reduction of the resonance-frequency band component in the input signal on the resonance frequency band basis so that the resulting audio is improved in quality.

Third Embodiment

Exemplary Configuration of Audio Signal Processing Apparatus

In order to reduce the gain in a resonance frequency band, described above is the case of modulating the amplitude of a resonance in-band signal by calculating a gain adjustment amount directly from an amount of resonance analysis features. Alternatively, the gain in the resonance frequency band may be reduced by using a notch filter or others to an input signal.

Figure 7:
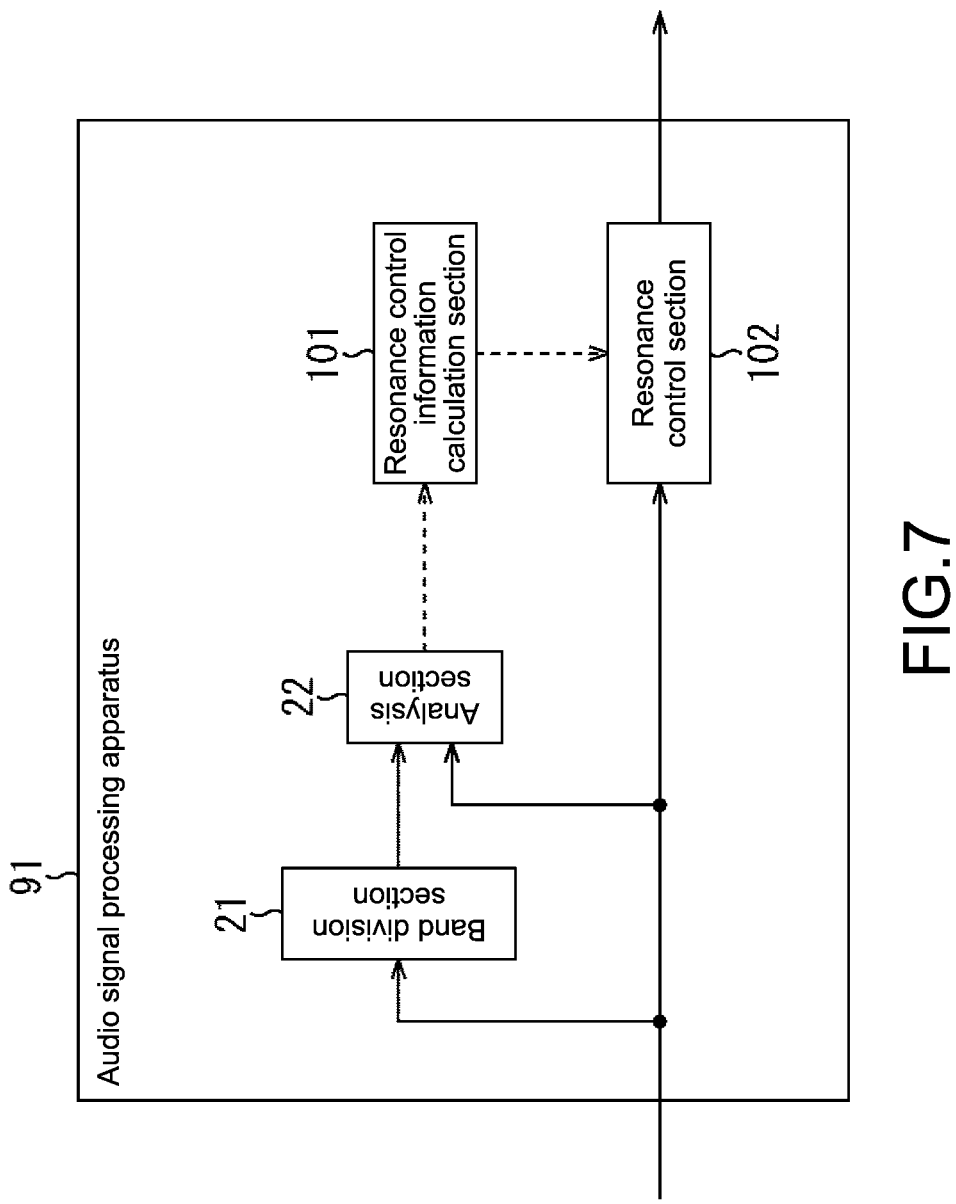
FIG. 7 is a diagram showing still another exemplary configuration of the audio signal processing apparatus of FIG. 1.

If this is the case, the audio signal processing apparatus is configured as shown in FIG. 7, for example. In FIG. 7, any component corresponding to that in FIG. 1 is provided with the same reference numeral, and is not described again if appropriate.

An audio signal processing apparatus 91 of FIG. 7 includes the band division section 21, the analysis section 22, a resonance control information calculation section 101, and a resonance control section 102.

Based on an amount of resonance analysis features provided by the analysis section 22, the resonance control information calculation section 101 calculates resonance control information for use to reduce a resonance-frequency band component. The resulting resonance control information is supplied to the resonance control section 102. Based on the resonance control information provided by the resonance control information calculation section 101, the resonance control section 102 reduces a resonance-frequency band component in an input signal, and outputs the resulting signal as an output signal.

For reducing the resonance-frequency band component in the input signal as above, when the resonance control section 102 performs filter processing using notch filter coefficients, i.e., performs notch filter processing, notch filter coefficients are calculated for use as the resonance control information. In the below, the resonance control section 102 is described to perform the notch filter processing.

[Description about Process of Reducing Resonance-Frequency Band Component]

Figure 8:
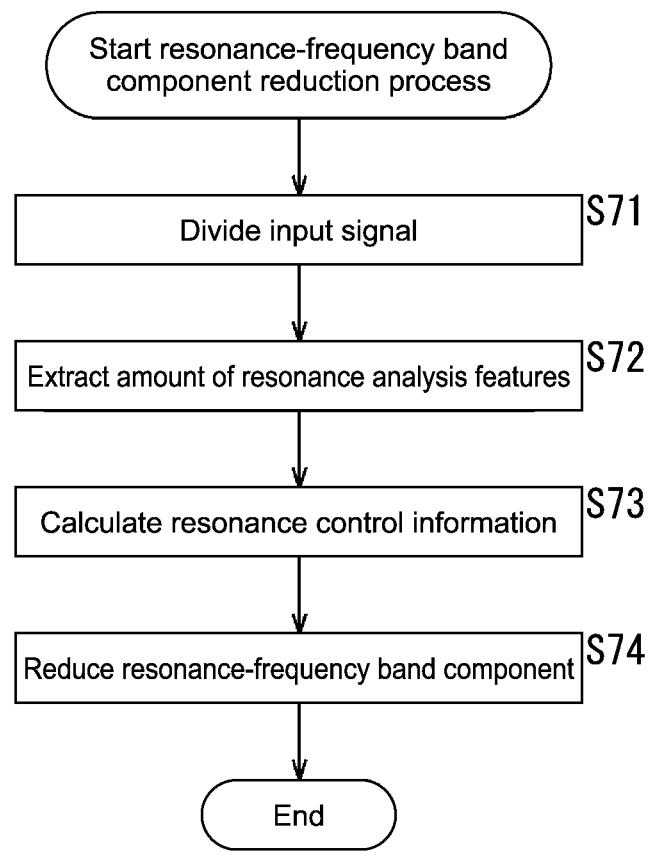
FIG. 8 is a flowchart of a resonance-frequency band component reduction process by the audio signal processing apparatus of FIG. 7.

Described next is the operation of the audio signal processing apparatus 91. By referring to a flowchart of FIG. 8, described below is a process of reducing a resonance-frequency band component by the audio signal processing apparatus 91.

In step S71, the band division section 21 divides an input signal into a resonance in-band signal and a resonance out-of-band signal. The resonance in-band signal is supplied to the analysis section 22.

In step S72, the analysis section 22 extracts an amount of features for resonance analysis from the provided signals, i.e., the input signal, and the resonance in-band signal provided by the band division section 21. The extracted amount of resonance analysis features is supplied to the resonance control information calculation section 101. The amount of resonance analysis features for use is exemplified by a root mean square RMS_ab(n) of the input signal, and a root mean square RMS_rb(n) of the resonance in-band signal.

In step S73, based on the amount of resonance analysis features provided by the analysis section 22, the resonance control information calculation section 101 calculates resonance control information. The obtained resonance control information is supplied to the resonance control section 102. In this embodiment, notch filter coefficients are calculated for use as the resonance control information.

In step S74, based on the resonance control information provided by the resonance control information calculation section 101, the resonance control section 102 reduces a resonance-frequency band component in the input signal, and outputs an output signal obtained thereby. To be specific, the input signal is subjected to notch filter processing using the notch filter coefficients being the resonance control information, thereby reducing a resonance-frequency band component in the input signal. That is, the resonance frequency band is adjusted in gain by the notch filter processing performed directly on the input signal. Upon output of the output signal, the resonance-frequency band component reduction process is ended.

In the manner described above, the audio signal processing apparatus 91 extracts an amount of features for resonance analysis from an input signal and a resonance in-band signal. By using resonance control information obtained based on the obtained amount of resonance analysis features, the audio signal processing apparatus 91 performs a gain adjustment on the resonance in-band signal of the input signal. This allows more appropriate reduction of the resonance-frequency band component in the input signal because consideration is given not only to the resonance frequency band but also to the entire frequency band in the input signal. The resulting audio is thus further improved in quality.

Fourth Embodiment

Exemplary Configuration of Audio Signal Processing Apparatus

Figure 9:
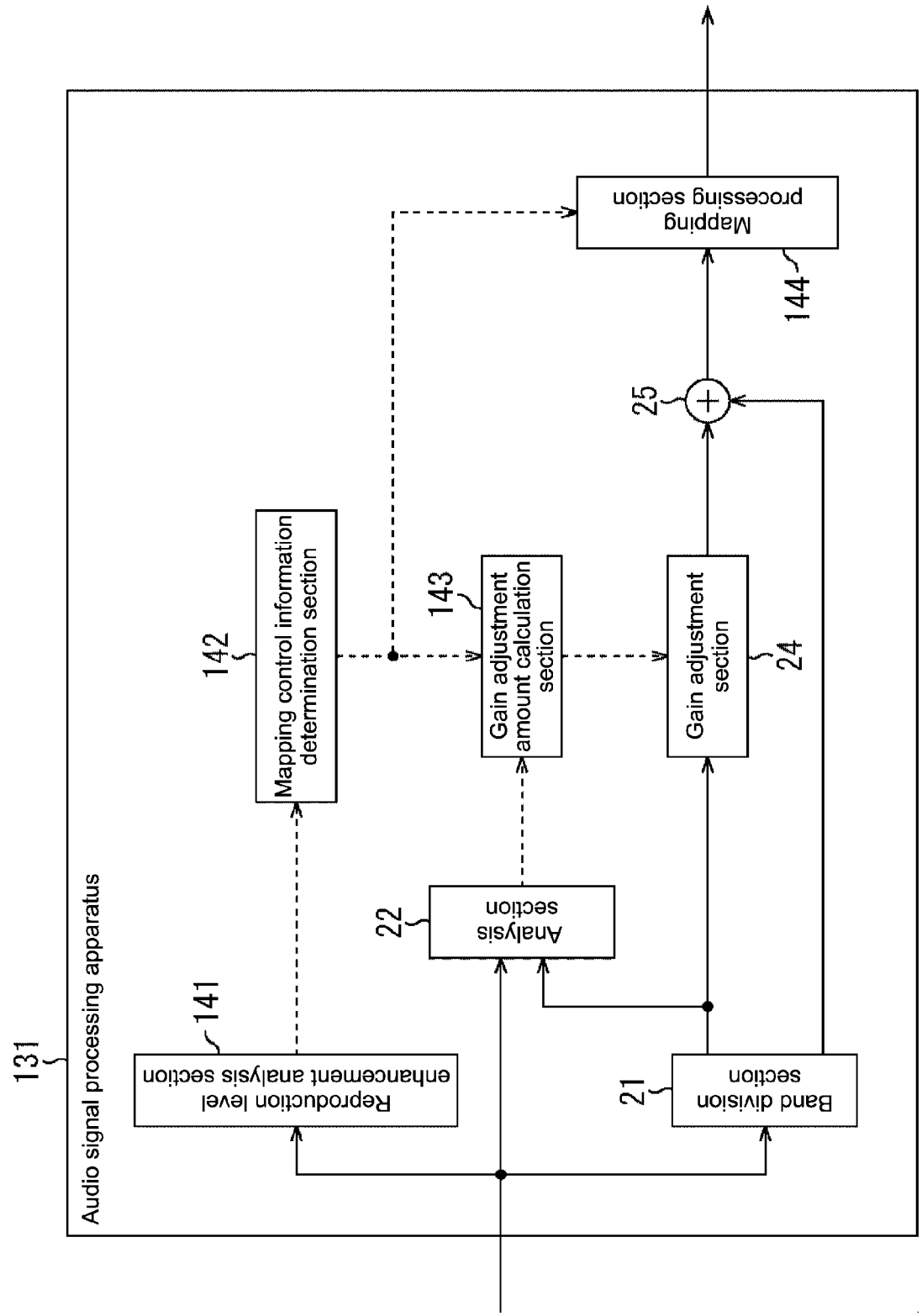
FIG. 9 is a diagram showing still another exemplary configuration of the audio signal processing apparatus of FIG. 1.

Described above is the case of performing a gain adjustment on a resonance-frequency band component in an input signal. Alternatively, a reproduction level enhancement may be performed on an input signal in addition to the gain adjustment on the resonance-frequency band component therein. If this is the case, the audio signal processing apparatus is configured as shown in FIG. 9, for example. In FIG. 9, any component corresponding to that in FIG. 1 is provided with the same reference numeral, and is not described again if appropriate.

An audio signal processing apparatus 131 of FIG. 9 includes the band division section 21, the analysis section 22, the gain adjustment section 24, the addition section 25, a reproduction level enhancement analysis section 141, a mapping control information determination section 142, a gain adjustment amount calculation section 143, and a mapping processing section 144.

The reproduction level enhancement analysis section 141 extracts an amount of features for reproduction level enhancement analysis from an input signal. The obtained amount of reproduction level enhancement analysis features is supplied to the mapping control information determination section 142.

By using a mapping control model learned in advance based on statistical analysis, the mapping control information determination section 142 calculates mapping control information from the amount of reproduction level enhancement analysis features from the reproduction level enhancement analysis section 141. The resulting mapping control information is supplied to both the gain adjustment amount calculation section 143, and the mapping processing section 144. Herein, the mapping control information indicates the degree of enhancement for the reproduction level of the input signal.

The gain adjustment amount calculation section 143 determines a gain adjustment amount based both on an amount of resonance analysis features provided by the analysis section 22, and the mapping control information provided by the mapping control information determination section 142. The obtained gain adjustment amount is supplied to the gain adjustment section 24.

Based on the mapping control information provided by the mapping control information determination section 142, the mapping processing section 144 performs mapping processing on a signal provided by the addition section 25, thereby enhancing the reproduction level of the input signal. The mapping processing section 144 outputs the resulting input signal with the enhanced reproduction level as a final output signal. The mapping processing uses a linear or nonlinear mapping function defined by the mapping control information so that the input signal is subjected to linear or nonlinear amplitude modulation.

[Description about Process of Reducing Resonance-Frequency Band Component]

Described next is the operation of the audio signal processing apparatus 131. By referring to a flowchart of FIG. 10, described below is a process of reducing a resonance-frequency band component by the audio signal processing apparatus 131. Processes in steps S101 and S102 are similar to those in steps S11 and S12 of FIG. 2, and thus are not described again.

In step S103, the reproduction level enhancement analysis section 141 extracts an amount of features for reproduction level enhancement analysis from an input signal. The obtained amount of reproduction level enhancement analysis features is supplied to the mapping control information determination section 142.

To be specific, by Equation 1 similarly to the above, the reproduction level enhancement analysis section 141 calculates a root mean square RMS(n) of the input signal for use as the amount of reproduction level enhancement analysis features.

In this embodiment, the input signal is analyzed with no preprocessing. That is, the input signal is subjected to extraction of an amount of features with no preprocessing. Therefore, the root mean square RMS(n) obtained for use as the amount of reproduction level enhancement analysis features is of equal value to a root mean square RMS_ab(n) obtained for use as an amount of resonance analysis features. Alternatively, the amount of reproduction level enhancement analysis features may be calculated after preprocessing of DC (Direct Current) cutting if appropriate.

Still alternatively, the amount of reproduction level enhancement analysis features for use may also be the t-th power of the root mean square RMS(n) (where t≥2), a zero crossing count, the shape of a wave envelope, or others, or an arbitrary combination thereof.

In step S104, by using a mapping control model, the mapping control information determination section 142 calculates mapping control information from the amount of reproduction level enhancement analysis features provided by the reproduction level enhancement analysis section 141. The obtained mapping control information is then supplied to both the gain adjustment amount calculation section 143, and the mapping processing section 144.

As an example, the mapping control information determination section 142 is recorded in advance with a mapping control model, which is generated by learning a linear regression model by the method of least squares with dependent variables being a plurality of pieces of mapping control information provided in advance for the learning, and with an independent variable being the amount of reproduction level enhancement analysis features also provided in advance for the learning. The mapping control model is exemplified by coefficients of a quadratic function represented by a curve C21 of FIG. 11, for example.

Figure 11:
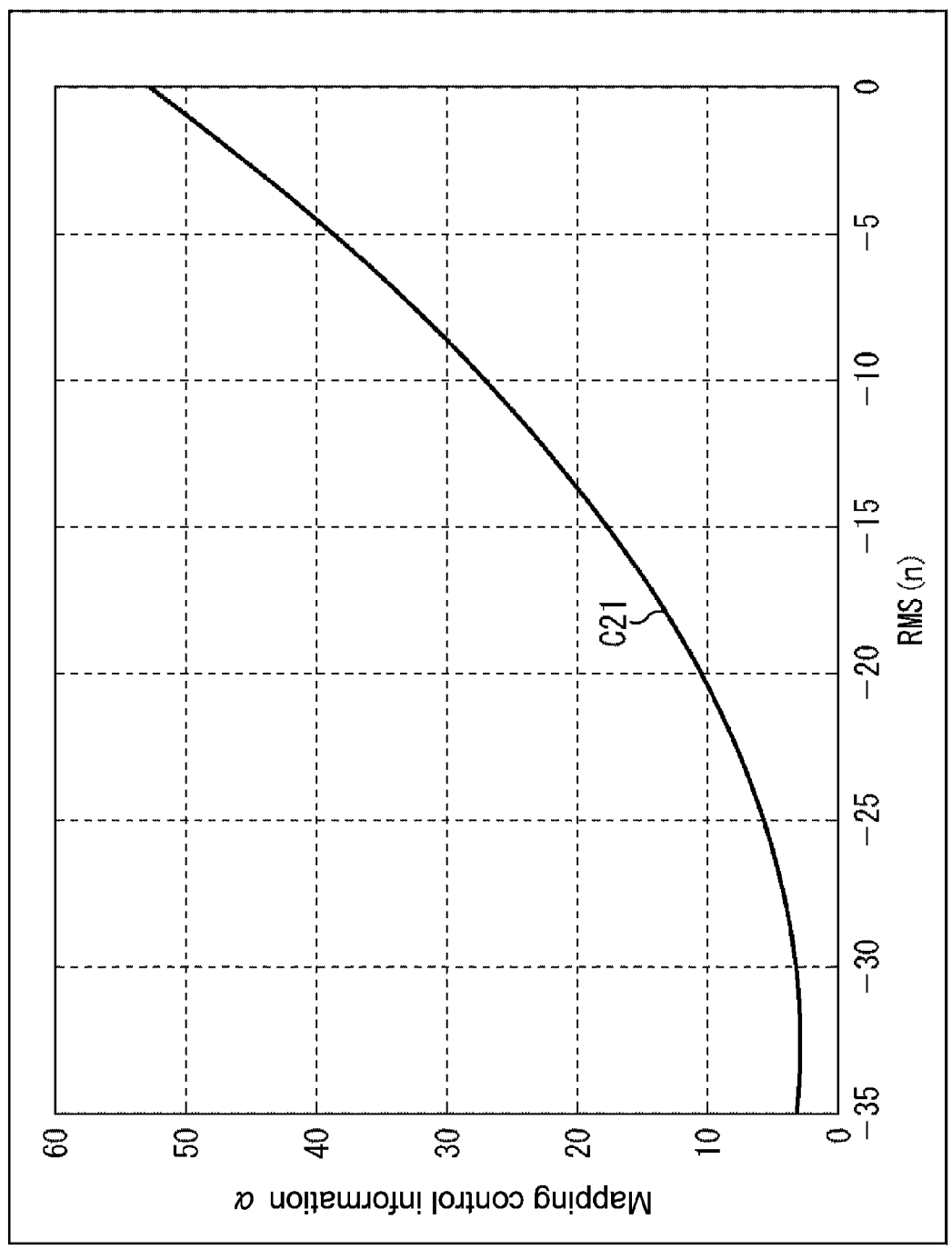
FIG. 11 is a diagram illustrating a mapping control model.

In FIG. 11, the vertical axis indicates mapping control information, and the horizontal axis indicates a root mean square RMS(n) being an amount of reproduction level enhancement analysis features.

Also in FIG. 11, the curve C21 indicates the value of mapping control information, which is defined by each amount of reproduction level enhancement analysis features. In this embodiment, the mapping control information is smaller in value with the lower sound volume of the input signal, and with the smaller amount of reproduction level enhancement analysis features.

The mapping control information determination section 142 obtains mapping control information by substituting the amount of reproduction level enhancement analysis features into a function defined by model parameters recorded thereon as the mapping control model.

Figure 10:
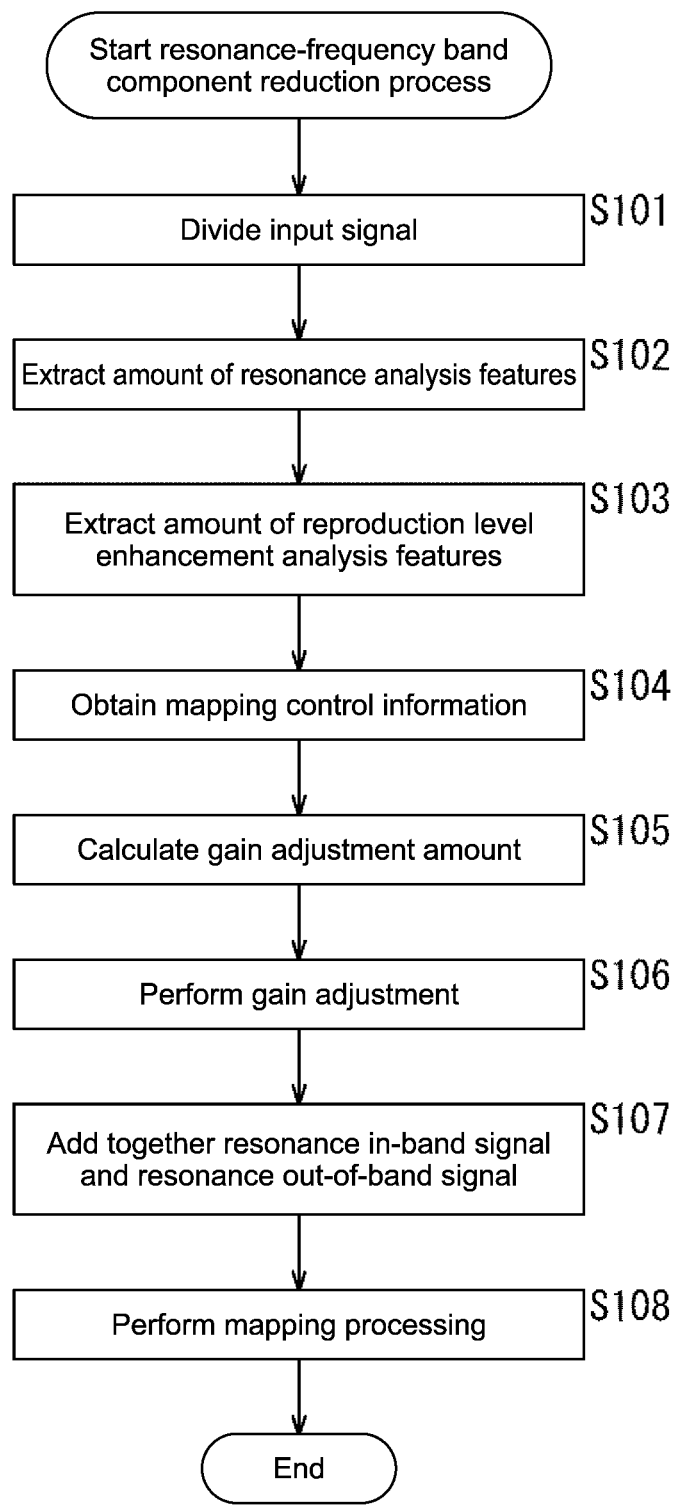
FIG. 10 is a flowchart of a resonance-frequency band component reduction process by the audio signal processing apparatus of FIG. 9.

By referring back to the flowchart of FIG. 10, after the mapping control information is obtained in step S104, the procedure goes to step S105 for processing.

In step S105, the gain adjustment amount calculation section 143 calculates a gain adjustment amount based on the amount of resonance analysis features provided by the analysis section 22, and the mapping control information provided by the mapping control information determination section 142. The obtained gain adjustment amount is supplied to the gain adjustment section 24.

The gain adjustment amount calculation section 143 is recorded in advance with a gain adjustment model, which is generated by learning with a dependent variable being a gain adjustment amount $F(X, Y)$, and with independent variables being the mapping control information in addition to the root mean squares RMS_ab(n) and RMS_rb(n) calculated for use as the amount of resonance analysis features.

The gain adjustment model obtained by learning in this embodiment is expressed also by Equation 3 above but where X denotes the sum of a root mean square RMS_ab(n) and a predetermined value β obtained from the mapping control information, and Y denotes the sum of a root mean square RMS_rb(n) and the predetermined value β. Herein, the predetermined value β is assumed to be a value obtained by Equation of β=h(α) that converts the mapping control information α into a value in the same dimension as the root mean square, i.e., a value obtained by substituting the mapping control information into the function h(α).

Also with such a gain adjustment model, similarly with the gain adjustment model of Equation 3, a greater proportion of a resonance in-band signal in an input signal increases a gain adjustment amount so that a resonance-frequency band component therein is reduced to a further degree.

In the subsequent mapping processing section 144, mapping processing is so performed that the input signal is more enhanced in reproduction level with the smaller value of the mapping control information. Therefore, with the gain adjustment model, a gain adjustment is increased with the smaller value of the mapping control information. That is, the degree of reproduction level enhancement during the mapping processing is used as a basis to reduce in advance a resonance-frequency band component.

Alternatively, a gain adjustment model of Equation 5 below may be used, for example. In Equation 5, X denotes a root mean square RMS_ab(n), Y denotes a root mean square RMS_rb(n), and Z denotes mapping control information. Also in Equation 5, a, b, c, d, e, f, and g are each a model parameter.

[Equation 5]

$$F(X,Y,Z)=aX^2+bX+cY^2+dY+eZ^2+fZ+g \quad (5)$$

The gain adjustment amount calculation section 143 calculates a gain adjustment amount using a function (equation) of a gain adjustment model recorded in advance. That is, the gain adjustment amount calculation section 143 substitutes, into the function, the amount of resonance analysis features, i.e., the root mean squares RMS_ab(n) and RMS_rb(n), and the mapping control information or a value β defined thereby.

In step S106, the gain adjustment section 24 modulates the amplitude of a resonance in-band signal from the band division section 21 based on the gain adjustment amount provided by the gain adjustment amount calculation section 143, thereby performing a gain adjustment on the resonance in-band signal. The resulting resonance in-band signal is supplied to the addition section 25.

In step S107, the addition section 25 adds together a resonance in-band signal from the gain adjustment section 24 and a resonance out-of-band signal from the band division section 21, and supplies the addition result to the mapping processing section 144. Note that the signal from the addition section 25, i.e., the signal being the result of addition between the resonance in-band signal and the resonance out-of-band signal, is hereinafter referred sometimes as addition signal.

In step S108, the mapping processing section 144 uses the mapping control information provided by the mapping control information determination section 142 to perform mapping processing on the addition signal provided by the addition section 25.

As an example, the mapping processing section 144 performs amplitude modulation on the addition signal by substituting a sample value x into a nonlinear mapping function f(x) of Equation 6 below. The sample value x is a value of the n-th sample being a processing target in the addition signal. That is, the value obtained by substitution of the sample value x into the mapping function f(x) is the value of the n-th sample in the final output signal. In this case, the sample value x of the addition signal is assumed to be normalized to take a value of −1.0 to 1.0. In Equation 6, α denotes a value of the mapping control information.

[Equation 6]

$$f(x) = \frac{\alpha}{\alpha - 1}\left(x - \frac{1}{\alpha}x^3\right)(-1.0 \le x \le 1.0) \quad (6)$$

Figure 12:
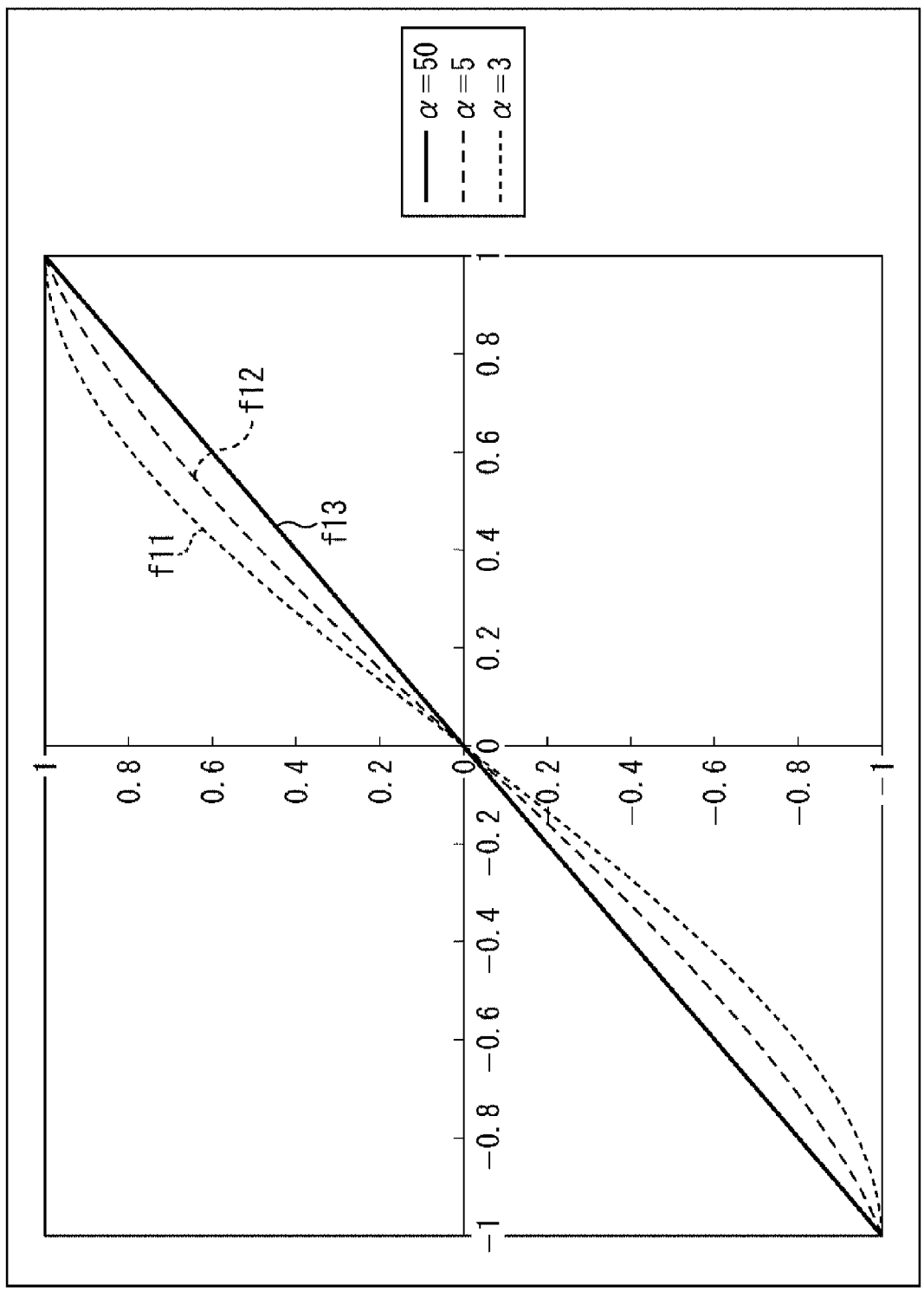
FIG. 12 is a diagram illustrating a mapping function.

As shown in FIG. 12, such a mapping function f(x) shows an abrupt change with the smaller value of the mapping control information. In FIG. 12, the horizontal axis indicates a sample value x of an addition signal, and the vertical axis indicates a value of the mapping function f(x). Also in FIG. 12, curves f11 to f13 respectively indicate the mapping function f(x) when the mapping control information α takes values of "3", "5", and "50".

As is known from FIG. 12, for amplitude modulation on the addition signal, with the smaller value of the mapping control information, the mapping function f(x) for use shows a large change of f(x) as a whole to a change of the sample value x. Varying the value of the mapping control information as above changes the degree of amplification for the addition signal (input signal).

When a root mean square RMS(n) is calculated for use as an amount of reproduction level enhancement analysis features, for example, the amount of reproduction level enhancement analysis features is reduced with the smaller sound volume of the input signal. This thus reduces the value of the mapping control information. Moreover, the smaller value of the mapping control information, the steeper the mapping function f(x) becomes.

Therefore, for amplitude modulation on an addition signal (input signal), with the mapping function f(x) for use, the smaller the sound volume of the input signal as a whole, the more abrupt the change of the mapping function f(x) becomes for the major portion of the interval of a sample value x including x=0.

This allows amplitude modulation of an input signal to be so performed that any sound low in volume is converted into sound higher in volume in the interval of the input signal where the sound volume is low as a whole, thereby enhancing the reproduction level of the input signal. In this manner, even when a device with a small-sized speaker reproduces contents with a wide audio dynamic range, for example, any low-volume sound that has been hard to listen becomes easy to listen.

Also in the interval of the input signal where the sound volume is high as a whole, for amplitude modulation of the input signal (addition signal), the mapping function f(x) for use shows an adequately abrupt change against any signal with a small sample value x therein.

This allows amplitude modulation of an input signal to be so performed that any sound low in volume is converted into audio higher in volume also in the interval of the input signal where the sound volume is high as a whole, thereby enhancing the reproduction level of the input signal. In this manner, any sound that has been reproduced relatively high in volume also becomes louder.

Furthermore, if the mapping control information is used to vary a nonlinear mapping function f(x), the amplitude modulation is performed with a higher flexibility. That is, by giving consideration to the features of the entire specific interval of the input signal, a nonlinear function regarded as having the most effective features is selected as a mapping function. This accordingly realizes amplitude modulation considering not only the features of an interval including a processing-target sample but also the value size of the sample.

The mapping function f(x) for use during the mapping processing is not restrictive to a nonlinear function. Alternatively, any function is applicable as long as the function satisfies $-1 \leq f(x) \leq 1$ with a sample value x satisfying $-1 \leq x \leq 1$, e.g., linear function or exponential function. The mapping function for use may be the one that is highly evaluated in terms of the effect of mapping processing, or is suitable for auditory perception, for example.

After performing the mapping processing to modulate the amplitude of the addition signal, the mapping processing section 144 outputs the resulting output signal. This is the end of the resonance-frequency band component reduction process.

In the manner described above, the audio signal processing apparatus 131 extracts an amount of features for resonance analysis from both an input signal and a resonance in-band signal, and extracts an amount of features for reproduction level enhancement analysis from the input signal to obtain mapping control information. The audio signal processing apparatus 131 then adjusts the gain in the resonance in-band signal using a gain adjustment amount obtained based both on the amount of resonance analysis features and the mapping control information. Based on the mapping control information, the audio signal processing apparatus 131 then adds together the resonance in-band signal and a resonance out-of-band signal to modulate the amplitude of an addition signal obtained thereby.

As described above, by calculating a gain adjustment amount using the amount of resonance analysis features and the mapping control information, a resonance-frequency band component in the input signal is reduced more appropriately, and the resulting sound is thus improved in quality. Especially when the technology of reproduction level enhancement is applied in combination, this allows reproduction level enhancement at the same time with effective resonance reduction, thereby realizing powerful sound reproduction with very high sound volume.

The series of processes described above may be performed by hardware or software. For the software to perform the series of processes described above, a program in the software is installed on a computer. Herein, the computer includes a computer in a hardware specifically designed therefor, or a general-purpose personal computer that may perform various functions by installation of various programs, for example.

Figure 13:
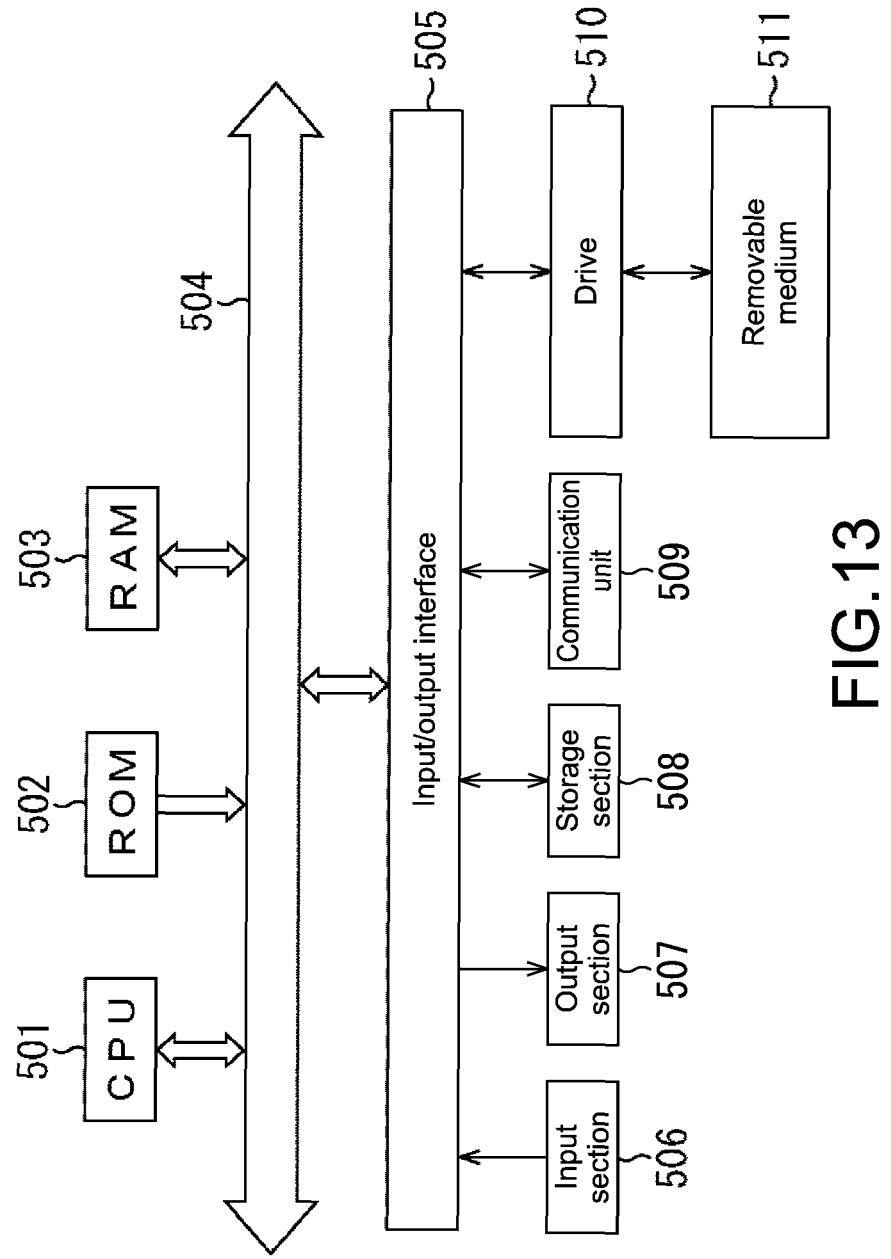
FIG. 13 is a diagram showing an exemplary configuration of a computer.

FIG. 13 is a block diagram showing an exemplary hardware configuration of a computer that performs the series of processes described above by running a program.

In the computer, a bus 504 connects together a CPU (Central Processing Unit) 501, a ROM (Read Only Memory) 502, and a RAM (Random Access Memory) 503.

The bus 504 is also connected with an input/output interface 505. The input/output interface 505 is connected with an input section 506, an output section 507, a storage section 508, a communication unit 509, and a drive 510.

The input section 506 includes a keyboard, a mouse, a microphone, an imaging element, or others, and the output section 507 includes a display, a speaker, or others. The storage section 508 is a hard disk, or a nonvolatile memory, for example. The communication unit 509 is a network interface, for example. The drive 510 drives a removable medium 511 exemplified by a magnetic disk, an optical disk, a magneto-optical disk, a semiconductor memory, or others.

With the computer in the above configuration, the series of processes described above are performed by the computer loading the program in the storage section 508 onto the RAM 503 via the input/output interface 505 and the bus 504, for example.

The program to be run by the computer (CPU 501) may be recorded on the removable medium 511 as a package medium or others for distribution. The program may be provided via a wired or wireless transmission medium including a local area network, the Internet, digital satellite broadcasting, or others.

With the computer, the program may be installed on the storage section 508 via the input/output interface 505 by mounting the removable medium 511 on the drive 510. The program may be installed on the storage section 508 by being received by the communication unit 509 via a wired or wireless transmission medium. The program may be also installed in advance on the ROM 502 or the storage section 508.

Note that, with the program to be run by the computer, processes may be performed in a time series manner in the described order, or in a parallel manner or anytime in response to a call.

The foregoing description of the embodiments of the present disclosure is in all aspects illustrative and not restrictive. It is understood that numerous other modulations and variations may be devised without departing from the scope of the present disclosure.

For example, the present disclosure is applicable to cloud computing with which a plurality of apparatuses are connected through a network for processing by sharing and collaboration of a function.

The steps in the flowcharts described above may be performed by one apparatus or by a plurality of apparatuses by sharing. When one step includes various types of processing, the various types of processing in the step may be performed by one apparatus or by a plurality of apparatuses by sharing.

The effect described in the present disclosure is in all aspects illustrative and not restrictive. It is understood that numerous other effects may be produced by the present disclosure.

The present disclosure may be also in the following structures:

(1) An audio signal processing apparatus, including:
    a band division section configured to generate a resonance in-band signal by band division on an audio input signal;
    an analysis section configured to extract an amount of features from each of the resonance in-band signal and the input signal;
    a gain adjustment amount calculation section configured to calculate a gain adjustment amount for a resonance frequency band in the input signal, the gain adjustment amount being calculated based on the amount of features of the resonance in-band signal and the amount of features of the input signal; and
    a gain adjustment section configured to perform a gain adjustment on the resonance frequency band in the input signal based on the gain adjustment amount.

(2) The audio signal processing apparatus according to (1), in which
   the gain adjustment amount calculation section calculates the gain adjustment amount based on the amount of features using a statistical analysis model generated by learning.
(3) The audio signal processing apparatus according to (1) or (2), in which
   the gain adjustment amount calculation section calculates the gain adjustment amount for each of the resonance frequency bands, and
   the gain adjustment section performs the gain adjustment on each of the resonance frequency bands.
(4) The audio signal processing apparatus according to any one of (1) to (3), further including:
   a mapping control information determination section configured to determine mapping control information based on an amount of reproduction level enhancement features and information, the amount of reproduction level enhancement features being extracted from the input signal, and the information being generated by leaning for obtaining the mapping control information from the amount of reproduction level enhancement features; and
   a mapping processing section configured to perform amplitude modulation on the gain-adjusted input signal based on a linear or nonlinear mapping function, the mapping function being defined by the mapping control information, in which
   the gain adjustment amount calculation section calculates the gain adjustment amount based on the mapping control information, and the amount of features extracted by the analysis section.
(5) The audio signal processing apparatus according to any one of (1) to (4), in which
   the gain adjustment amount is increased with the greater proportion of the resonance in-band signal included in the input signal.
(6) The audio signal processing apparatus according to any one of (1) to (3), in which
   the band division section divides the input signal into the resonance in-band signal and a resonance out-of-band signal,
   the gain adjustment section performs the gain adjustment on the resonance in-band signal, and
   further including an addition section configured to add the gain-adjusted resonance in-band signal and the resonance out-of-band signal.
(7) An audio signal processing method, including:
   generating a resonance in-band signal by band division on an audio input signal;
   extracting an amount of features from each of the resonance in-band signal and the input signal;
   calculating a gain adjustment amount for a resonance frequency band in the input signal, the gain adjustment amount being calculated based on the amount of features of the resonance in-band signal and the amount of features of the input signal; and
   performing a gain adjustment on the resonance frequency band in the input signal based on the gain adjustment amount.
(8) A program causing a computer
   to generate a resonance in-band signal by band division on an audio input signal,
   to extract an amount of features from each of the resonance in-band signal and the input signal,
   to calculate a gain adjustment amount for a resonance frequency band in the input signal, the gain adjustment amount being calculated based on the amount of features of the resonance in-band signal and the amount of features of the input signal, and
   to perform a gain adjustment on the resonance frequency band in the input signal based on the gain adjustment amount.

It should be understood by those skilled in the art that various modulations, combinations, sub-combinations and alterations may occur depending on design requirements and other factors insofar as they are within the scope of the appended claims or the equivalents thereof.

What is claimed is:

1. An audio signal processing apparatus, comprising:
   a band division section configured to generate a resonance in-band signal by band division of an audio input signal;
   an analysis section configured to extract features from each of the generated resonance in-band signal and the audio input signal;
   a gain adjustment amount calculation section configured to calculate a gain adjustment amount for a resonance frequency band in the audio input signal, the gain adjustment amount is calculated based on the extracted features of the resonance in-band signal and the extracted features of the audio input signal; and
   a gain adjustment section configured to adjust a gain of the resonance frequency band in the audio input signal based on the calculated gain adjustment amount.

2. The audio signal processing apparatus according to claim 1, wherein the gain adjustment amount calculation section is further configured to calculate the gain adjustment amount based on the features using a statistical analysis model.

3. The audio signal processing apparatus according to claim 1, wherein
   the gain adjustment amount calculation section is further configured to calculate the gain adjustment amount for each of resonance frequency bands, and
   the gain adjustment section is further configured to adjust the gain of each of the resonance frequency bands.

4. The audio signal processing apparatus according to claim 1, further comprising:
   a mapping control information determination section configured to determine mapping control information based on a reproduction level enhancement features and information, the reproduction level enhancement features are extracted from the audio input signal, and the information is generated for obtaining the mapping control information from the reproduction level enhancement features; and
   a mapping processing section configured to perform amplitude modulation on the gain-adjusted audio input signal based on one of linear or nonlinear mapping functions that are defined by the mapping control information, wherein
   the gain adjustment amount calculation section is further configured to calculate the gain adjustment amount based on the mapping control information, and the features extracted by the analysis section.

5. The audio signal processing apparatus according to claim 1,
   wherein
   the gain adjustment amount is increased with the resonance in-band signal included in the audio input signal to minimize the resonance frequency band.

6. The audio signal processing apparatus according to claim 1,
wherein
the band division section is further configured to divide the audio input signal into the resonance in-band signal and a resonance out-of-band signal,
the gain adjustment section is further configured to adjust the gain adjustment of the resonance in-band signal, and
further including an addition section configured to add the gain-adjusted resonance in-band signal and the resonance out-of-band signal.

7. The audio signal processing apparatus according to claim 1, wherein the resonance in-band signal is at a resonance frequency in the audio input signal.

8. The audio signal processing apparatus according to claim 1, wherein the resonance in-band signal includes a resonance-frequency band component.

9. The audio signal processing apparatus according to claim 1,
wherein the band division section is further configured to generate the resonance in-band signal and a resonance out-of-band signal, and
wherein the resonance out-of-band signal includes a first component that is different from a resonance-frequency band component.

10. The audio signal processing apparatus according to claim 1, wherein the band division section is further configured to supply the generated resonance in-band signal to both the analysis section and the gain adjustment section.

11. An audio signal processing method, comprising:
generating a resonance in-band signal by band division of an audio input signal;
extracting features from each of the generated resonance in-band signal and the audio input signal;
calculating a gain adjustment amount for a resonance frequency band in the audio input signal, the gain adjustment amount is calculated based on the extracted features of the resonance in-band signal and the extracted features of the audio input signal; and
adjusting a gain of the resonance frequency band in the audio input signal based on the calculated gain adjustment amount.

12. A non-transitory computer readable medium having stored thereon, computer-executable instructions thereby causing a computer to execute operations, comprising:
generating a resonance in-band signal by band division of an audio input signal,
extracting features from each of the generated resonance in-band signal and the audio input signal,
calculating a gain adjustment amount for a resonance frequency band in the audio input signal, the gain adjustment amount is calculated based on the extracted features of the resonance in-band signal and the extracted features of the audio input signal, and
adjusting a gain of the resonance frequency band in the audio input signal based on the calculated gain adjustment amount.

* * * * *